(12) United States Patent
Huang

(10) Patent No.: US 7,629,839 B2
(45) Date of Patent: Dec. 8, 2009

(54) PREAMPLIFIER AND METHOD FOR CALIBRATING OFFSET VOLTAGES THEREIN

(75) Inventor: Chih-Haur Huang, Sinshih Township, Tainan County (TW)

(73) Assignee: Himax Media Solutions, Inc. (TW)

( * ) Notice: Subject to any disclaimer, the term of this patent is extended or adjusted under 35 U.S.C. 154(b) by 0 days.

(21) Appl. No.: 12/115,157

(22) Filed: May 5, 2008

(65) Prior Publication Data

US 2009/0273395 A1    Nov. 5, 2009

(51) Int. Cl.
*H03F 1/02* (2006.01)
(52) U.S. Cl. .......................................... 330/9
(58) Field of Classification Search .............. 330/9, 330/259; 327/124, 307
See application file for complete search history.

(56) References Cited

U.S. PATENT DOCUMENTS 6,710,645 B2 * 3/2004 Isken et al. ................. 330/9
7,532,065 B2 * 5/2009 Chen et al. ................. 330/9

* cited by examiner

*Primary Examiner*—Khanh V Nguyen
(74) *Attorney, Agent, or Firm*—Hayes Soloway P.C.

(57) ABSTRACT

A preamplifier includes cascade-connected amplifying circuits, and at least one of the cascade-connected amplifying circuits includes a differential switch pair circuit, a comparator and current sources. The differential switch pair circuit has a pair of differential inputs and a pair of differential outputs. The comparator outputs a comparison signal by comparing the differential outputs. The current sources are respectively and selectively coupled to one of the differential outputs based on the comparison signal to adjust voltages of the differential outputs. A method for calibrating offset voltages in a preamplifier is also disclosed herein.

19 Claims, 4 Drawing Sheets

PREAMPLIFIER AND METHOD FOR CALIBRATING OFFSET VOLTAGES THEREIN

BACKGROUND

1. Field of Invention

The present invention relates to an amplifying circuit in a receiver. More particularly, the present invention relates to a preamplifier and method for calibrating offset voltages therein in a receiver.

2. Description of Related Art

For a conventional preamplifier in a receiver, there are usually a number of stages of cascade-connected amplifying circuits in the preamplifier. Small differential signals are input into the preamplifier and sequentially amplified by the cascade-connected amplifying circuits to be the large differential signals. However, each of the amplifying circuits in the preamplifier often has more or less offsets in itself, such that the amplified differential signals output by the amplifying circuit may have different common voltage levels therebetween.

As a result, the large differential signals output from the preamplifier may have the problem of duty cycle distortion, and the skew tolerance of the receiver could be thus decreased.

SUMMARY

In accordance with one embodiment of the present invention, a preamplifier is provided. The preamplifier includes a plurality of cascade-connected amplifying circuits, and at least one of the cascade-connected amplifying circuits includes a differential switch pair circuit, a comparator and a plurality of current sources. The differential switch pair circuit has a pair of differential inputs and a pair of differential outputs. The comparator outputs a comparison signal by comparing the differential outputs. The current sources are respectively and selectively coupled to one of the differential outputs based on the comparison signal to adjust voltages of the differential outputs.

In accordance with another embodiment of the present invention, a method for calibrating offset voltages in a preamplifier is provided. The method includes the steps of: comparing with each other a pair of differential outputs of a differential switch pair circuit of at least one of cascade-connected amplifying circuits in the preamplifier to output a comparison signal; and coupling respectively and selectively a plurality of current sources to one of the differential outputs based on the comparison signal to adjust voltages of the differential outputs.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
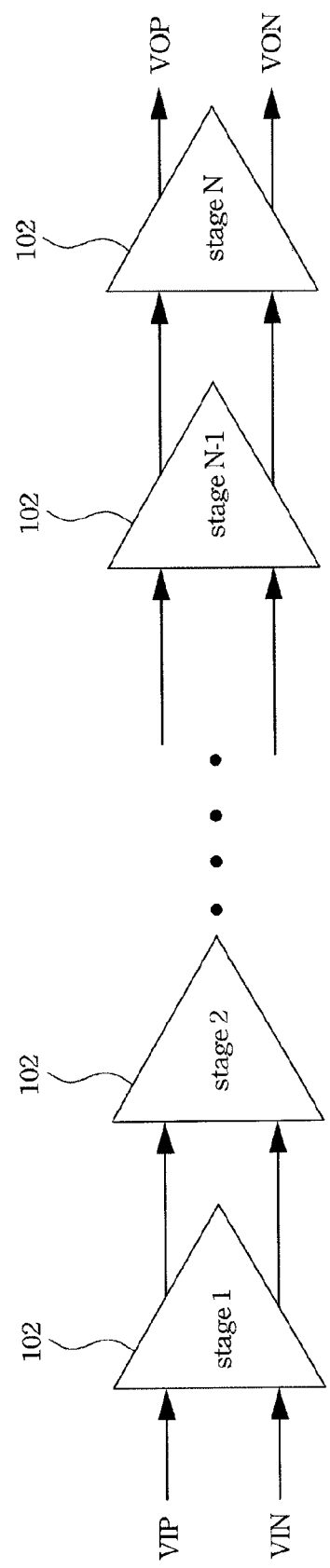
FIG. 1 illustrates a preamplifier according to one embodiment of the present invention.

FIG. 1 illustrates a preamplifier according to one embodiment of the present invention. The preamplifier 100 includes a number (e.g. N) of stages of cascade-connected amplifying circuits 102, in which each of the amplifying circuits 102 can be a current mode logic (CML) circuit. Small differential signals VIP and VIN are input into the $1^{st}$ stage of the amplifying circuits 102 and sequentially amplified by the cascade-connected amplifying circuits 102. After that, the amplified differential signals VOP and VON are output from the $N^{th}$ stage of the amplifying circuits 102.

Figure 2:
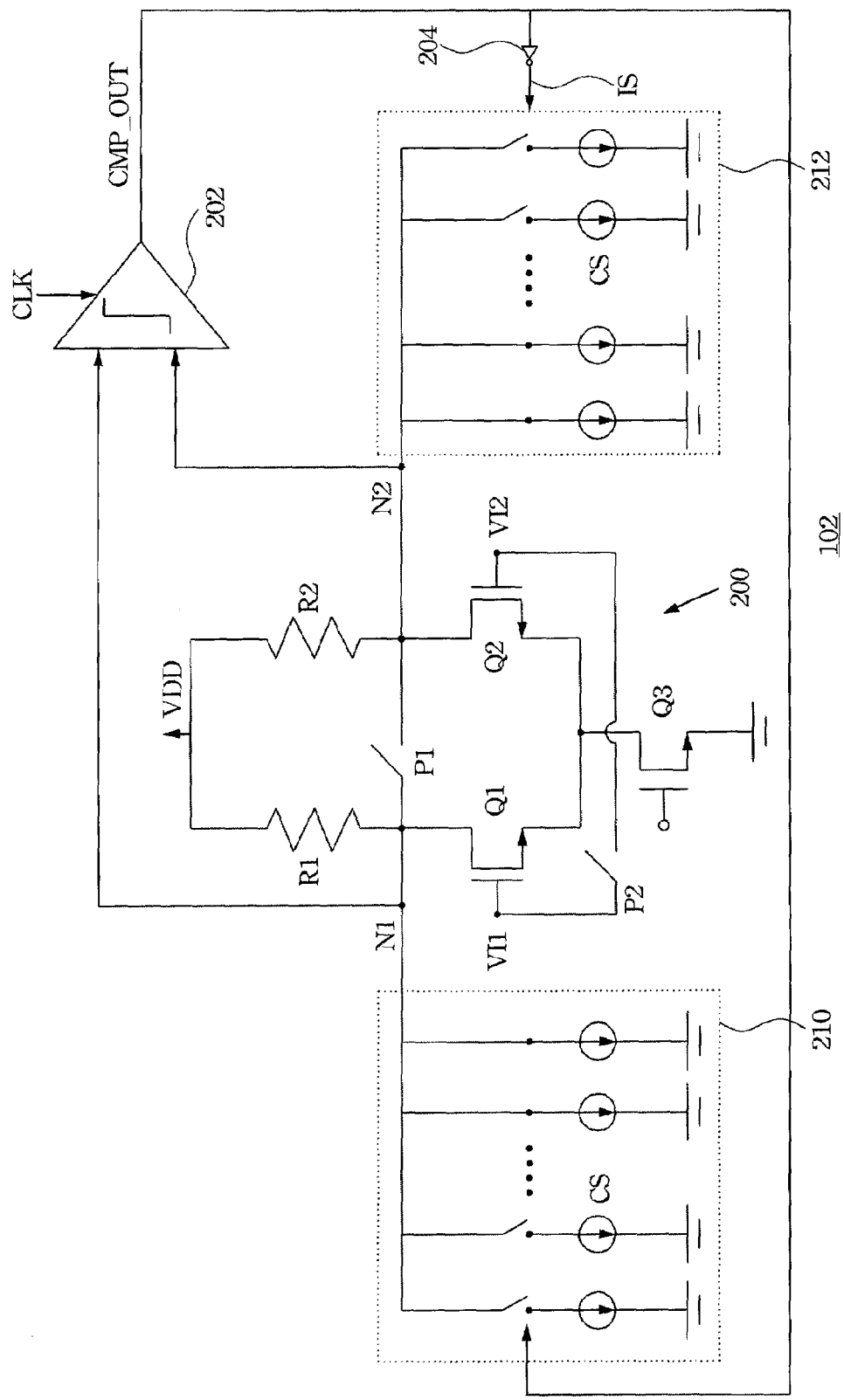
FIG. 2 illustrates the circuit in one of the amplifying circuits shown in FIG. 1 according to one embodiment of the present invention.

FIG. 2 illustrates the circuit in one of the amplifying circuits shown in FIG. 1 according to one embodiment of the present invention. It is noticed that at least one of the amplifying circuits 102 shown in FIG. 1 can include the same circuit as shown in FIG. 2. In one embodiment, the $1^{st}$ stage of the amplifying circuits 102 includes the same circuit as shown in FIG. 2.

The amplifying circuit 102 includes a differential switch pair circuit 200 (including transistors Q1, Q2, Q3 and resistors R1, R2), a comparator 202, a number of current sources CS, a first switch P1, a second switch P2, and an inverter 204. The differential switch pair circuit 200 has a pair of differential inputs (i.e. VI1 and VI2) and a pair of differential outputs (i.e. N1 and N2). The switch P1 is coupled between the differential outputs N1 and N2 and short-circuits the differential outputs N1 and N2 when turned on. The switch P2 is coupled between the differential inputs VI1 and VI2 and short-circuits the differential inputs VI1 and VI2 when turned on. The comparator 202 outputs a comparison signal CMP_OUT by comparing the differential outputs N1 and N2. The inverter 204 receives the comparison signal to output an inverting signal IS.

The current sources CS are separated into a first part 210 and a second part 212, each of which includes, for example, the same number of the current sources CS. The current sources CS can be all the same, partially the same or even different from one another, based on the requirement in practice. For the first part 210, the current sources CS can be, for example, half turned on to couple to the differential output N1 and half turned off at an initial state. Similarly, for the second part 212, the current sources CS can be, for example, half turned on to couple to the differential output N2 and half turned off at the initial state as well. Besides, a number of the current sources CS coupled to the differential output N1 can be, for example, the same as that of the current sources CS coupled to the differential output N2 at the initial state.

The current sources CS are respectively and selectively coupled to one of the differential outputs N1 and N2 based on the comparison signal CMP_OUT. That is, the current sources CS of the first part 210 are respectively and selectively coupled to the differential output N1 based on the comparison signal CMP_OUT to adjust the voltage of the differential output N1, or the current sources CS of the second part 212 are respectively and selectively coupled to the differential output N2 based on the inverting signal IS, converted from the comparison signal CMP_OUT to adjust the voltage of the differential output N2. Nevertheless, for the current sources CS, a number of the current sources CS of the second part 212 are decoupled from the differential output N2 based on the inverting signal IS while the same number of the current sources CS of the first part 210 are coupled to the differential output N1 based on the comparison signal CMP_OUT, or a number of the current sources CS of the second part 212 are coupled to the differential output N2 based on the inverting signal IS while the same number of the current sources CS of the first part 210 are decoupled from the differential output N1 based on the comparison signal CMP_OUT.

The following describes the offset calibration in the preamplifier according to one embodiment of the present invention. First, if the switch P1 is turned on such that the differential outputs N1 and N2 are short-circuited, the comparator 202 outputs the comparison signal CMP_OUT according to a self-offset voltage of the comparator 202. At the moment, a corresponding number of the current sources CS of the first part 210 are respectively and selectively coupled to the differential output N1 based on the comparison signal CMP_OUT, and the same number of the current sources CS of the second part 212 are respectively and selectively decoupled from the differential output N2 based on the inverting signal IS, so as to adjust the voltages of the differential outputs N1 and N2 and to calibrate the self-offset voltage of the comparator 202 accordingly.

After that, if the switch P1 is turned off and the switch P2 is turned on, such that the differential inputs VI1 and VI2 are short-circuited, the comparator 202 outputs the comparison signal CMP_OUT according to an offset voltage between the differential outputs N1 and N2. At the moment, a corresponding number of the current sources CS of the first part 210 are respectively and selectively coupled to the differential output N1 based on the comparison signal CMP_OUT, and the same number of the current sources CS of the second part 212 are respectively and selectively decoupled from the differential output N2 based on the inverting signal IS, so as to adjust the voltages of the differential outputs N1 and N2 once again and to calibrate the offset voltage between the differential outputs N1 and N2 accordingly.

Thereafter, if the switches P1 and P2 both are turned off, the differential signals are input into the differential inputs VI1 and VI2. Since the voltages of the differential outputs N1 and N2 have been adjusted in the foregoing steps, the amplified differential signals output from the differential outputs N1 and N2 have no offset voltages therebetween.

Figure 3:
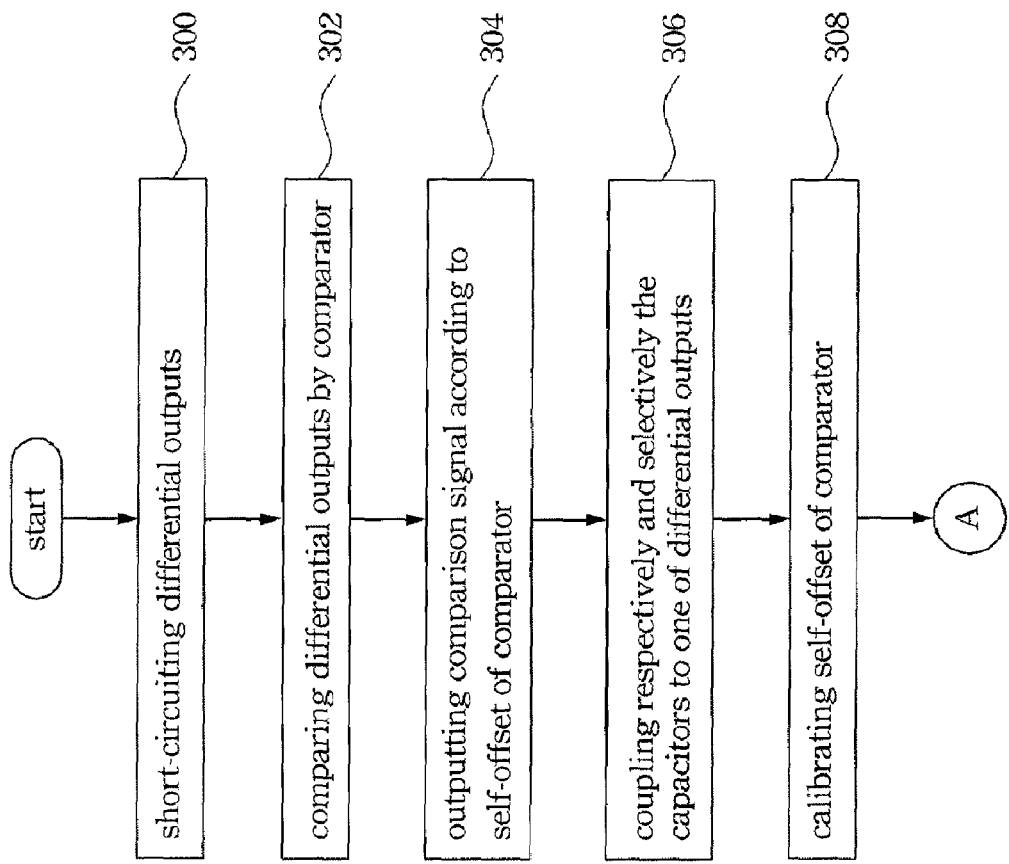
FIG. 3 and FIG. 4 illustrate a flow chart of a method for calibrating offset voltages in a preamplifier according to one embodiment of the present invention.
Figure 4:
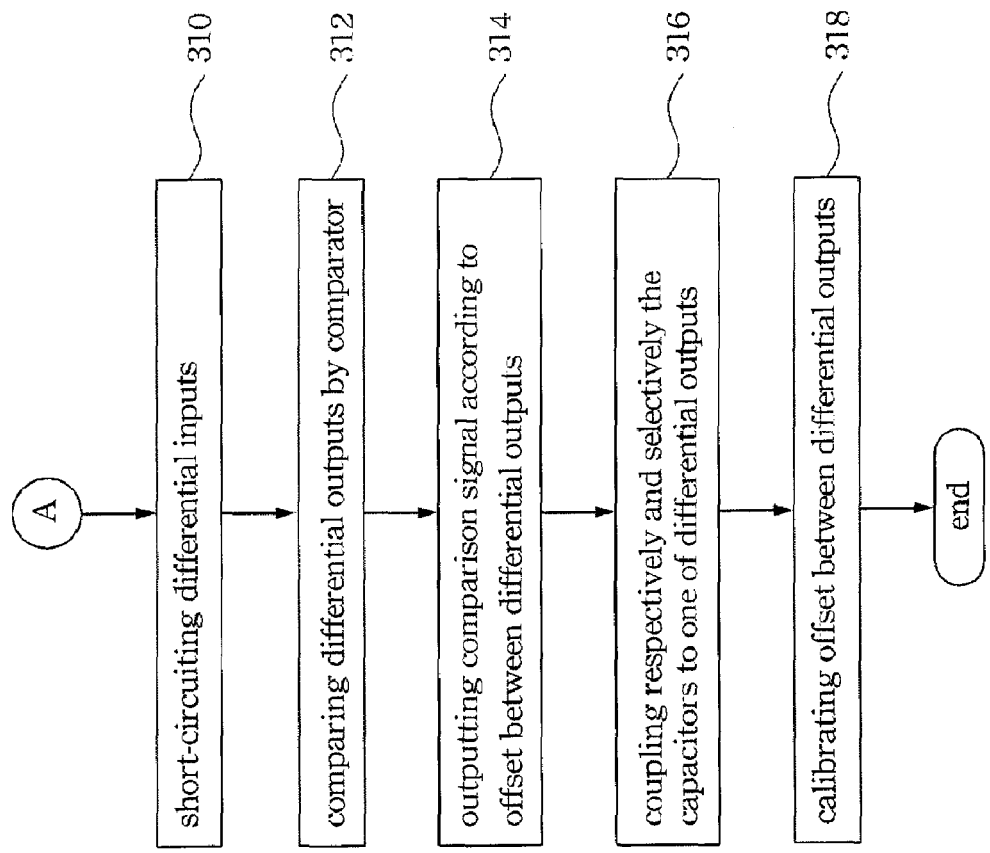

FIG. 3 and FIG. 4 illustrates a flow chart of a method for calibrating offset voltages in a preamplifier according to one embodiment of the present invention. Refer to FIG. 2, FIG. 3 and FIG. 4. First, the differential outputs N1 and N2 are short-circuited (Step 300). Then, the differential outputs N1 and N2 are compared with each other by the comparator 202 (Step 302). After that, the comparison signal CMP_OUT is output by the comparator 202 according to the self-offset voltage of the comparator 202 (Step 304).

Thereafter, the current sources CS are respectively and selectively coupled to one of the differential outputs N1 and N2 based on the comparison signal CMP_OUT (Step 306), so as to adjust the voltages of the differential outputs N1 and N2. That is, the current sources CS of the first part 210 are respectively and selectively coupled to the differential output N1 based on the comparison signal CMP_OUT to adjust the voltage of the differential output N1, or the current sources CS of the second part 212 are respectively and selectively coupled to the differential output N2 based on the inverting signal IS, which is output by converting the comparison signal CMP_OUT, to adjust the voltage of the differential output N2. It is noticed herein that a number of the current sources CS of the second part 212 can be decoupled from the differential output N2 based on the inverting signal IS while the same number of the current sources CS of the first part 210 can be coupled to the differential output N1 based on the comparison signal CMP_OUT, or a number of the current sources CS of the second part 212 can be coupled to the differential output N2 based on the inverting signal IS while the same number of the current sources CS of the first part 210 can be decoupled from the differential output N1 based on the comparison signal CMP_OUT. Further, a number of the current sources can be coupled to the differential output N1 and the same number of the current sources CS can be coupled to the differential output N2 at the initial state. Then, the self-offset voltage of the comparator 202 is calibrated by respectively and selectively coupling the current sources CS to one of the differential outputs N1 and N2 (Step 308).

Next, the differential inputs VI1 and VI2 are short-circuited (Step 310). Then, the differential outputs N1 and N2 are compared with each other by the comparator 202 once again (Step 312). After that, the comparison signal CMP_OUT is output by the comparator 202 according to the offset voltage between the differential outputs N1 and N2 (Step 314). Thereafter, the current sources CS are respectively and selectively coupled to one of the differential outputs N1 and N2 based on the comparison signal CMP_OUT once again (Step 316), so as to re-adjust the voltages of the differential outputs N1 and N2. Then, the offset voltage between the differential outputs N1 and N2 is calibrated by respectively and selectively coupling the current sources CS to one of the differential outputs N1 and N2 (Step 318). As a result, the amplified differential signals output from the differential outputs N1 and N2 have no offset therebetween.

For the foregoing embodiments, the preamplifier and method for calibrating offset voltages therein can be provided to reduce the offset voltages in the preamplifier, such that the amplified differential signals output by the preamplifier have the same common voltage level therebetween, so as to solve the problem of the duty cycle distortion and the decreased skew tolerance of the receiver.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A preamplifier, comprising:
   a plurality of cascade-connected amplifying circuits, at least one of the cascade-connected amplifying circuits comprising:
      a differential switch pair circuit having a pair of differential inputs and a pair of differential outputs;
   a comparator outputting a comparison signal by comparing the differential outputs; and
   a plurality of current sources respectively and selectively coupled to one of the differential outputs based on the comparison signal to adjust voltages of the differential outputs.

2. The preamplifier as claimed in claim 1, further comprising:

an inverter for receiving the comparison signal to output an inverting signal.

3. The preamplifier as claimed in claim 2, wherein a number of the current sources are decoupled from one of the differential outputs based on the inverting signal while the same number of the current sources are coupled to the other of the differential outputs based on the comparison signal.

4. The preamplifier as claimed in claim 2, wherein a number of the current sources are coupled to one of the differential outputs based on the inverting signal while the same number of the current sources are decoupled from the other of the differential outputs based on the comparison signal.

5. The preamplifier as claimed in claim 1, further comprising:
a switch coupled between the differential outputs and short-circuiting the differential outputs when turned on.

6. The preamplifier as claimed in claim 5, wherein when the differential outputs are short-circuited, the comparator outputs the comparison signal according to a self-offset voltage of the comparator.

7. The preamplifier as claimed in claim 6, wherein the current sources are respectively and selectively coupled to one of the differential outputs based on the comparison signal to calibrate the self-offset voltage of the comparator.

8. The preamplifier as claimed in claim 1, further comprising:
a switch coupled between the differential inputs and short-circuiting the differential inputs when turned on.

9. The preamplifier as claimed in claim 8, wherein when the differential inputs are short-circuited, the comparator outputs the comparison signal according to an offset voltage between the differential outputs.

10. The preamplifier as claimed in claim 9, wherein the current sources are respectively and selectively coupled to one of the differential outputs based on the comparison signal to calibrate the offset voltage between the differential outputs.

11. The preamplifier as claimed in claim 1, wherein a number of the current sources coupled to one of the differential outputs is the same as that of the current sources coupled to the other of the differential outputs at an initial state.

12. The preamplifier as claimed in claim 1, wherein each amplifying circuit is a current mode Logic (CML) circuit.

13. A method for calibrating offset voltages in a preamplifier, the method comprising the steps of:
comparing with each other a pair of differential outputs of a differential switch pair circuit of at least one of cascade-connected amplifying circuits in the preamplifier to output a comparison signal; and
coupling respectively and selectively a plurality of current sources to one of the differential outputs based on the comparison signal to adjust voltages of the differential outputs.

14. The method as claimed in claim 13, further comprising the steps of:
inverting the comparison signal to output an inverting signal; and
decoupling a number of the current sources from one of the differential outputs based on the inverting signal while coupling the same number of the current sources to the other of the differential outputs based on the comparison signal.

15. The method as claimed in claim 13, further comprising the steps of:
inverting the comparison signal to output an inverting signal; and
coupling a number of the current sources to one of the differential outputs based on the inverting signal while decoupling the same number of the current sources from the other of the differential outputs based on the comparison signal.

16. The method as claimed in claim 13, wherein the step of comparing the differential outputs with each other is carried out by a comparator.

17. The method as claimed in claim 16, further comprising the steps of:
short-circuiting the differential outputs;
outputting the comparison signal according to a self-offset voltage of the comparator; and
calibrating the self-offset voltage of The comparator by coupling respectively and selectively the current sources to one of the differential outputs.

18. The method as claimed in claim 13, further comprising the steps of:
short-circuiting a pair of differential inputs of the differential switch pair circuit;
outputting the comparison signal according to an offset voltage between the differential outputs; and
calibrating the offset voltage between The differential outputs by coupling respectively and selectively the current sources to one of the differential outputs.

19. The method as claimed in claim 13, further comprising the step of:
coupling a number of the current sources to one of the differential outputs and coupling the same number of the current sources to the other of the differential outputs at an initial state.

* * * * *